US006754002B2

(12) United States Patent
Borrelli et al.

(10) Patent No.: US 6,754,002 B2
(45) Date of Patent: Jun. 22, 2004

(54) PHOTOLITHOGRAPHY METHODS AND SYSTEMS

(75) Inventors: Nicholas F. Borrelli, Elmira, NY (US); Charlene M. Smith, Corning, NY (US); Johannes Moll, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 31 days.

(21) Appl. No.: 09/967,841

(22) Filed: Sep. 27, 2001

(65) Prior Publication Data

US 2002/0077244 A1 Jun. 20, 2002

Related U.S. Application Data

(60) Provisional application No. 60/237,621, filed on Oct. 3, 2000.

(51) Int. Cl.$^7$ .............................. G02B 13/14; C03C 3/04
(52) U.S. Cl. .......................... 359/355; 359/642; 501/54
(58) Field of Search ................................ 501/54; 430/5, 430/322, 323; 252/588; 65/416, 421, 422, 424, 17, 30, 32, 399, 414, 426, 427; 359/350, 355, 642, 900

(56) References Cited

U.S. PATENT DOCUMENTS

| | | | |
|---|---|---|---|
| 5,086,352 A | | 2/1992 | Yamagata et al. |
| 5,139,606 A | | 8/1992 | Maki |
| 5,141,786 A | | 8/1992 | Shimizu et al. |
| 5,325,230 A | | 6/1994 | Yamagata et al. |
| 5,364,433 A | | 11/1994 | Nishimura et al. |
| 5,410,428 A | | 4/1995 | Yamagata et al. |
| 5,616,159 A | | 4/1997 | Araujo et al. |
| 5,668,067 A | | 9/1997 | Araujo et al. |
| 5,707,908 A | | 1/1998 | Komine et al. |
| 5,735,921 A | | 4/1998 | Araujo et al. |
| 5,880,817 A | | 3/1999 | Hashimoto |
| 5,896,222 A | | 4/1999 | Rosplock et al. |
| 6,031,238 A | * | 2/2000 | Fujinoki et al. ......... 250/492.2 |
| 6,058,739 A | | 5/2000 | Morton et al. |
| 6,174,830 B1 | | 1/2001 | Jinbo et al. |
| 6,181,724 B1 | | 1/2001 | Tanaka et al. |
| 6,242,136 B1 | | 6/2001 | Moore et al. |
| 2001/0000508 A1 | | 4/2001 | Jinbo et al. |
| 2001/0012099 A1 | | 8/2001 | Kumagai |

FOREIGN PATENT DOCUMENTS

EP        0 779 558 A2   6/1997

OTHER PUBLICATIONS

Primak et al., "The Radiation Compaction of Vitreous Silica," *J. Appl. Phys.*, 39(12):5651–5658 (1968).
Hill et al., "Photosensitivity in Optical Fiber Waveguides: Application to Reflection Filter Fabrication," *Appl. Phys. Lett.*, 32(10):647–649 (1978).
Shelby, "Radiation Effects in Hydrogen–impregnated Vitreous Silica," *J. Appl. Phys.*, 50(5):3702–3706 (1979).
Rothschild et al., "Effects of Excimer Laser Irradiation on the Transmission, Index of Refraction, and Density of Ultraviolet Grade Fused Silica," *Appl. Phys. Lett.*, 55(13):1276–1278 (1989).
Lemaire et al., "High Pressure H2 Loading as a Technique for Achieving Ultrahigh UV Photosensitivity and Thermal Sensitivity in GeO2 Doped Optical Fibers," *Electronics Letters*, 29(13):1191–1193 (1993).
Allan et al., "193–nm Excimer–laser–induced Densification of Fused Silica," *Opt. Lett.*, 21(24):1960–1962 (1996).
Schenker et al., "Material Limitations to 193–nm Lithographic System Lifetimes", *Proc. SPIE*, 2726:698–706 (1996).
Borrelli et al., "Densification of Fused Silica Under 193–nm Excitation," *J. Opt. Soc. Am. B*, 14(7):1606–1615 (1997).
Collier et al., "Semiconductor Fabrication Drives Deep–UV Optics," *Laser World Focus*, pp. 63–70 (Dec., 1998).
Borrelli et al., "Excimer–laser induced Densification in Binary Silica Glasses," *Opt. Lett.*, 24(20):1401–1403 (1999).
Liberman et al., "Excimer–laser–induced Densification of Fused Silica: Laser–fluence and Material–grade Effects on the Scaling Law," *J. Non–Cryst. Solids*, 244:159–171 (1999).
Van Peski et al., "Behavior of Fused Silica Irradiated by Low Level 193 nm Excimer Laser for Tens of Billions of Pulses," *J. Non–Cryst. Solids*, 265:285–289 (2000).

* cited by examiner

*Primary Examiner*—Karl Group
*Assistant Examiner*—Elizabeth A. Bolden
(74) *Attorney, Agent, or Firm*—James V. Suggs

(57) ABSTRACT

Lithographic methods are disclosed. In one such method, a pulsed ultraviolet radiation source for producing ultraviolet lithography radiation having a wavelength shorter than about 300 nm at a fluence of less than 10 mJ/cm$^2$/pulse and a high purity fused silica lithography glass having a concentration of molecular hydrogen of between about 0.02× 10$^{18}$ molecules/cm$^3$ and about 0.18×10$^{18}$ molecules/cm$^3$ are provided. A lithography pattern is formed with the ultraviolet lithography radiation; the lithography pattern is reduced to produce a reduced lithography pattern; and the reduced lithography pattern is projected onto a ultraviolet radiation sensitive lithography medium to form a printed lithography pattern. At least one of the forming, reducing, and projecting steps includes transmitting the ultraviolet lithography radiation through the high purity fused silica lithography glass. Lithography systems and high purity fused silica lithography glass are also described.

10 Claims, 12 Drawing Sheets

PHOTOLITHOGRAPHY METHODS AND SYSTEMS

The present invention claims the benefit of U.S. Provisional Patent Application Ser. No. 60/237,621, filed Oct. 3, 2000, which is hereby incorporated by reference.

FIELD OF THE INVENTION

The subject invention is directed, generally, to methods and systems suitable for use in photolithography and, more particularly, to methods and systems suitable for use in photolithography employing ArF excimer lasers.

BACKGROUND OF THE INVENTION

Projection optical lithography systems have been used for some time now in the manufacture of integrated circuits. Recently, driven in part by the desire to achieve smaller and smaller features, optical lithography systems used by the semiconductor industry in the manufacture of integrated circuits have progressed towards shorter wavelengths of light, such as the popular 248 nm and 193 nm wavelengths. Such systems benefit greatly from the use of refractive optics made from materials having high transmittance. High purity fused silica exhibits the desired transmittance and, consequently, has become a widely-used material for making the refractive optics found in 248 nm and 193 nm photolithographic systems. In addition, high purity fused silica exhibits excellent chemical durability and dimensional stability, and these properties have also made high purity fused silica well suited for use as optical lenses and other optical components in photolithographic systems.

The behavior of high purity fused silica for 248 and 193 nm laser-based photolithography has been extensively studied. In particular, these studies have included investigations into laser-induced "damage", both damage due to induced absorption and damage due to induced density changes. In general, these studies have been carried out at a relatively high exposure fluence in order to accelerate the test. For example, rather than performing the test for a period of time T using an exposure fluence of F, the test would be performed for a period of time T/x using an exposure fluence of xF, on the theory that the aggregate amount of light to which the sample is exposed would be the same in either case. Using these accelerated tests, all silica, irrespective of the supplier, exhibit positive induced density changes, a phenomenon commonly referred to as "densification" or "compaction". Furthermore, again using these accelerated tests, the densification behavior has been quantitatively described over a wide range of exposures by a power-law expression having the following form ("Equation 1"):

$$\frac{\Delta \rho}{\rho} = a \left( \frac{NF^2}{\tau} \right)^b$$

where $\Delta \rho / \rho$ represents the relative density change, F is the exposure fluence, N is the number of pulses, $\tau$ is a measure of the pulse duration, and b and $\alpha$ are constants which may vary from wavelength to wavelength but do not vary from glass to glass. Thus, it has generally been believed that a high purity silica glass will experience a laser-induced change in its index of refraction, but that this change evolves in a predictable way (e.g., as described by Equation 1) so that some sort of programmed correction can be applied (e.g., by adjusting the positions and/or orientation of lenses or other optical components).

To further understand the behavior of high purity silica glasses in laser-based photolithography systems, tests were recently conducted at the exposure fluences more appropriate to those which are typically employed in actual laser-based photolithography systems. The results showed that high purity silica glasses behave differently, depending on the supplier of the silica sample. For example, in certain samples, "expansion" (i.e., decreased density), not desification, was observed after exposure to laser radiation. These tests and results are described in Van Peski et al., *J. Non-Cryst. Sol.,* 265:285 (2000) ("Van Peski"), which is hereby incorporated by reference.

Applicants have further studied the effects of pulsed ultraviolet radiation exposure on high purity silica glasses using two methods: birefringence and interferometry. Each of these methods measures a different aspect of the same induced volume change. The former measures birefringence which results from the stresses that are produced by volume changes (e.g., densification or expansion), whereas interferometry measures changes in the refractive index associated with the volume change caused by densification or expansion. In the high fluence work cited above (i.e., in the accelerated tests), estimates of the volume change as measured by the two techniques have agreed within experimental error.

Applicants have found that, when the dissolved molecular hydrogen concentration in high purity fused silica is above a certain level (e.g., above $0.5 \times 10^{18}$ molecules $H_2/cm^3$ $SiO_2$) and when the fluence is low (e.g., below roughly 10 $mJ/cm^2$/pulse), changes in the high purity fused silica's refractive index resulting from exposure to pulsed ultraviolet radiation cannot be fully explained in terms of densification, such as predicted by Equation 1 or as described in, e.g., Borrelli et. al, *J. Opt. Soc. Am. B,* 14(7):1606 (1997), which is hereby incorporated by reference.

More particularly, applicants have found that there are two additional effects concurrent with the expected densification when silica with high molecular hydrogen content is exposed to low fluence ultraviolet radiation. They are expansion and photorefraction. As used herein, "photorefraction" is meant to refer to a refractive index increase that occurs without any volume change. Furthermore, applicants have observed that the magnitude of both of these effects is strongly dependent on the fluence and the molecular hydrogen concentration. Moreover, because the photorefraction effect has no stress associated with it, birefringence measurements do not give the same result as interferometry for high purity fused silica having high molecular hydrogen concentration exposed to relatively low fluence. In general, the laser damage specification is in terms of wavefront distortion, which in turn is strongly dependent on changes in refractive index. Since interferometry measures refractive index directly, it is the more appropriate measurement. On the other hand, if birefringence is used to estimate the refractive index change, it will only see changes originating from the volume changes. This, coupled with the fact that prior investigations into laser-induced damage have used accelerated tests (e.g., as described above, using relatively high exposure fluences), has resulted in an inaccurate understanding of the factors which should be taken into account with regard to molecular hydrogen concentration when designing or selecting high purity silica glasses for use in ultraviolet photolithography and other methods which employ pulsed ultraviolet radiation. Accordingly, a need continues to exist for new ultraviolet photolithography methods and systems.

SUMMARY OF THE INVENTION

The present invention relates to a lithography method. A pulsed ultraviolet radiation source for producing ultraviolet lithography radiation having a wavelength shorter than about 300 nm at a fluence of less than 10 mJ/cm$^2$/pulse and a high purity fused silica lithography glass having a concentration of molecular hydrogen of between about 0.02× 10$^{18}$ molecules/cm$^3$ and about 0.18×10$^{18}$ molecules/cm$^3$ are provided. A lithography pattern is formed with the ultraviolet lithography radiation. The lithography pattern is reduced to produce a reduced lithography pattern, and the reduced lithography pattern is projected onto a ultraviolet radiation sensitive lithography medium to form a printed lithography pattern. At least one of the forming, reducing, and projecting steps includes transmitting the ultraviolet lithography radiation through the high purity fused silica lithography glass.

The present invention relates to another lithography method. In this method, a pulsed ultraviolet radiation source for producing ultraviolet lithography radiation having a wavelength shorter than about 300 nm at a fluence of less than 10 mJ/cm$^2$/pulse and a high purity fused silica lithography glass having a concentration of molecular hydrogen of between about 0.05×10$^{18}$ molecules/cm$^3$ and 0.18×10$^{18}$ molecules/cm$^3$ or having a concentration of molecular hydrogen of between 0.22×10$^{18}$ molecules/cm$^3$ and about 0.5×10$^{18}$ molecules/cm$^3$ are provided. A lithography pattern is formed with the ultraviolet lithography radiation. The lithography pattern is reduced to produce a reduced lithography pattern, and the reduced lithography pattern is projected onto a ultraviolet radiation sensitive lithography medium to form a printed lithography pattern. At least one of the forming, reducing, and projecting steps includes transmitting the ultraviolet lithography radiation through the high purity fused silica lithography glass.

The present invention also relates to lithography systems which include a pulsed ultraviolet radiation source for producing ultraviolet lithography radiation having a wavelength shorter than about 300 nm at a fluence of less than 10 mJ/cm$^2$/pulse. The lithography systems also include at least one synthetic glass optical member which transmits lithography radiation from the pulsed ultraviolet radiation source. In one inventive lithography system, the at least one synthetic glass optical member includes a high purity fused silica lithography glass having a concentration of molecular hydrogen of between about 0.02×10$^{18}$ molecules/cm$^3$ and about 0.18×10$^{18}$ molecules/cm$^3$. In another inventive lithography system, the at least one synthetic glass optical member includes a high purity fused silica lithography glass having a concentration of molecular hydrogen of between about 0.05×10$^{18}$ molecules/cm$^3$ and 0.18×10$^{18}$ molecules/cm$^3$ or having a concentration of molecular hydrogen of between 0.22×10$^{18}$ molecules/cm$^3$ and about 0.5×10$^{18}$ molecules/cm$^3$.

The present invention also relates to a method for producing a synthetic high purity fused silica glass optical member having a predictably evolving wavefront distortion when exposed to pulsed ultraviolet lithography radiation having a wavelength shorter than about 300 nm at a fluence of less than 10 mJ/cm$^2$/pulse. The method includes limiting molecular hydrogen concentration in the high purity fused silica glass optical member to between about 0.05×10$^{18}$ molecules/cm$^3$ and about 0.5×10$^{18}$ molecules/cm$^3$.

The present invention also relates to synthetic glass optical members for use with pulsed ultraviolet radiation having a wavelength shorter than about 200 nm and a fluence of less than about 8 mJ/cm$^2$/pulse. In one inventive synthetic glass optical member, the member includes a high purity fused silica glass having a concentration of molecular hydrogen of between about 0.05×10$^{18}$ molecules/cm$^3$ and about 0.18×10$^{18}$ molecules/cm$^3$. In another inventive synthetic glass optical member, the member includes a high purity fused silica glass having a concentration of molecular hydrogen of between about 0.05×10$^{18}$ molecules/cm$^3$ and 0.18×10$^{18}$ molecules/cm$^3$ or having a concentration of molecular hydrogen of between 0.22×10$^{18}$ molecules/cm$^3$ and about 0.5×10$^{18}$ molecules/cm$^3$. In still another inventive synthetic glass optical member, the member includes high purity fused silica glass having a concentration of molecular hydrogen sufficiently low so that wavefront distortion caused by the high purity fused silica glass evolves predictably over time.

BRIEF DESCRIPTION OF THE DRAWINGS

FIGS. 3A and 3C are vector diagrams of one quadrant which show the direction of the slow axis. FIGS. 3B and 3D are line diagrams which indicate the magnitude of the birefringence.

FIG. 4A is a vector diagram of one quadrant which shows the direction of the slow axis. FIG. 4B is a line diagram which indicates the magnitude of the birefringence.

DETAILED DESCRIPTION OF THE INVENTION

Figure 1:
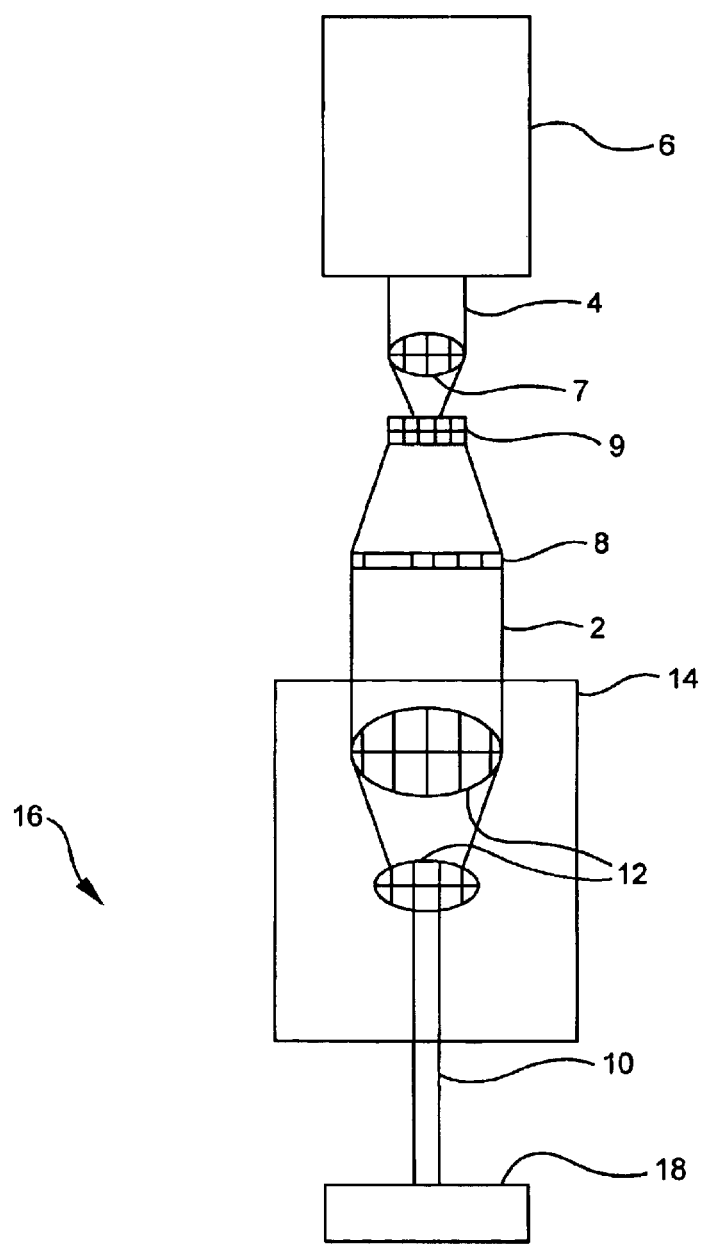
FIG. 1 is a schematic drawing showing a lithographic system and process in accordance with the present invention.

The present invention relates to a lithography method. The method includes providing a pulsed ultraviolet radiation source for producing ultraviolet lithography radiation having a wavelength shorter than about 300 nm at a fluence of less than 10 mJ/cm$^2$/pulse. Suitable radiation wavelengths include those shorter than about 250 nm, for example, those shorter than about 200 nm, such as the 193 nm radiation produced by an ArF excimer laser. Illustratively, suitable light sources for use in the practice of the present invention include ArF excimer lasers.

The method of the present invention also includes providing a high purity fused silica lithography glass. As used herein, "high purity fused silica lithography glass" is meant to refer to silica glasses which contain greater than 95% (e.g., greater than 98%, greater than 99%, etc.) $SiO_2$ by weight. Such glasses can contain other materials, for example, from 500–2000 ppm of OH and/or up to about 2000 ppb (e.g., from 100–1000 ppb) of impurities other than OH by weight, so long as such other materials do not render the glass unsuitable for photolithographic applications. Optimally, it is desirable to use silica glass of the highest possible purity. However, since synthetic silica glass can be slightly contaminated during heat treatment or other stages of the production of an optical member, the term "high purity" should be understood to include silica glasses in which the total amount of Li, Na, and K is 150 ppb or less; in which the total amount of Mg and Ca is 100 ppb or less; and/or in which the total amount of Ti, Cr, Fe, Ni, and Cu is 50 ppb or less. Preferably, the impurity content is such that the amounts of metal impurities which may adversely affect transmission of ultraviolet radiation are low (e.g., Na<50 ppb, K<50 ppb, Li<50 ppb, Mg<10 ppb, Ca<10 ppb, Ti<10 ppb, Cr<10 ppb, Fe<10 ppb, Ni<10 ppb, and/or Cu<10 ppb, each as measured, for example, by radioactivation analysis or atomic absorption spectrometry).

High purity fused silica lithography glasses useful in the methods of the present invention can be produced by a variety of methods.

In one suitable method, synthetic silica glass ingots are prepared in a furnace chamber which contains a burner head. An inert support (e.g., a glass rod) is extended into the furnace chamber where gases from the burner head can impinge against the end of the rod. Hydrogen gas is introduced into the chamber and a raw material gas (e.g., $SiCl_4$ or $CH_3Si(OCH_3)_3$) is introduced to the burner. Oxygen is introduced into the raw material gas line and/or directly into the burner head. The raw material is oxidized at the burner head to form droplets of molten silica, which are collected and cooled on the inert support to form an ingot of synthetic silica glass. Further details with regard to this method can be found, for example, in U.S. Pat. No. 5,086,352 to Yamagata et al. ("Yamagata"), which is hereby incorporated by reference.

In another method, a polymethylsiloxane, such as octamethylcyclosiloxane, is used as a silica precursor. A gas is bubbled through the siloxane to entrain vapors. These vapors are transported to a combustion burner. There, the siloxane precursor is converted by thermal decomposition, either with oxidation or by hydrolysis, to fused silica particles. The particles are deposited or collected, and they are then consolidated to form a transparent body of fused silica. This method is described, for example, in U.S. Pat. No. 5,896,222 to Rosplock et al. and U.S. Pat. No. 5,043,002 to Dobbins et al, which are hereby incorporated by reference.

In yet another suitable method, commonly referred to as the chemical vapor deposit soot remelting method, as the CVD method, and as the soot method, an inert support (e.g., a glass rod) is inserted into a furnace which is equipped with an electric heater. A burner is also extended into the furnace so that the gases from the burner can impinge against the end of the inert support. In this method, a raw material gas (e.g., $SiCl_4$ or $CH_3Si(OCH_3)_3$) is introduced together with an inert gas such as argon or helium into the burner along with oxygen gas, and hydrogen gas is introduced through a tube surrounding the burner. Additional oxygen can also be introduced through a concentric outer tube. The raw material gas is oxidized to form a silica "fog" which is condensed and collected on the end of the inert support to form a porous silica ingot, which can then be consolidated. This method is further described in Yamagata, which is hereby incorporated by reference.

The resulting high purity fused silica body, usually larger than a lens blank, can be sliced to form appropriate sized blanks, and these blanks can be surface-finished to provide lenses or other synthetic glass optical members that are suitable for use in photolithography.

The high purity fused silica lithography glass has molecular hydrogen concentration of between about $0.02 \times 10^{18}$ molecules/cm$^3$ and about $0.5 \times 10^{18}$ molecules/cm$^3$. As used in this context, "molecules/cm$^3$" is meant to refer to the number of molecules of molecular $H_2$ present in the high purity fused silica lithography glass per cubic centimeter of high purity fused silica lithography glass, for example, as measured by the strength of the 4135 cm$^{-1}$ stretching mode of $H_2$. Illustrative ranges of molecular hydrogen concentration which can be used in the practice of the present invention include: between about $0.02 \times 10^{18}$ molecules/cm$^3$ and about $0.18 \times 10^{18}$ molecules/cm$^3$; between about $0.05 \times 10^{18}$ molecules/cm$^3$ and $0.18 \times 10^{18}$ molecules/cm$^3$; between $0.22 \times 10^{18}$ molecules/cm$^3$ and about $0.5 \times 10^{18}$ molecules/cm$^3$; between about $0.3 \times 10^{18}$ molecules/cm$^3$ and $0.5 \times 10^{18}$ molecules/cm$^3$; between $0.22 \times 10^{18}$ molecules/cm$^3$ and about $0.3 \times 10^{18}$ molecules/cm$^3$; between about $0.05 \times 10^{18}$ molecules/cm$^3$ and about $0.5 \times 10^{18}$ molecules/cm$^3$; between about $0.05 \times 10^{18}$ molecules/cm$^3$ and $0.1 \times 10^{18}$ molecules/cm$^3$; and/or between about $0.05 \times 10^{18}$ molecules/cm$^3$ and $0.08 \times 10^{18}$ molecules/cm$^3$. Other illustrative suitable ranges of molecular hydrogen concentration which can be used in the practice of the present invention include: between about $0.02 \times 10^{18}$ molecules/cm$^3$ and about $0.21 \times 10^{18}$ molecules/cm$^3$; between about $0.19 \times 10^{18}$ molecules/cm$^3$ and about $0.5 \times 10^{18}$ molecules/cm$^3$; between $0.05 \times 10^{18}$ molecules/cm$^3$ and about $0.21 \times 10^{18}$ molecules/cm$^3$; between about $0.02 \times 10^{18}$ molecules/cm$^3$ and $0.4 \times 10^{18}$ molecules/cm$^3$; between about $0.02 \times 10^{18}$ molecules/cm$^3$ and $0.5 \times 10^{18}$ molecules/cm$^3$; between $0.05 \times 10^{18}$ molecules/cm$^3$ and $0.4 \times 10^{18}$ molecules/cm$^3$; and/or between $0.05 \times 10^{18}$ molecules/cm$^3$ and $0.5 \times 10^{18}$ molecules/cm$^3$.

Additionally or alternatively, the high purity fused silica lithography glass's molecular hydrogen concentration can be characterized in terms of its effect on wavefront distortion. As used herein, wavefront distortion is meant to include changes to the wavefront caused, for example by the high purity silica glass's index of refraction. Applicants have discovered that, at low fluence (e.g., at fluences less than 10 mJ/cm$^2$/pulse, such as at fluences of less than about 8 mJ/cm$^2$/pulse, of less than about 6 mJ/cm$^2$/pulse, of less than about 4 mJ/cm$^2$/pulse, of less than about 2 mJ/cm$^2$/pulse, of less than about 1.5 mJ/cm$^2$/pulse, of less than about 1 mJ/cm$^2$/pulse, of less than about 0.5 mJ/cm$^2$/pulse, of less than about 0.2 mJ/cm$^2$/pulse, of less than about 0.1 mJ/cm$^2$/pulse, of less than about 0.05 mJ/cm$^2$/pulse, and/or of less than about 0.02 mJ/cm$^2$/pulse), wavefront distortion evolves predictably over time when the high purity silica glass contains molecular hydrogen at low concentrations but does not evolve predictably over time when the high purity silica glass contains molecular hydrogen at high concentrations. More particularly, applicants have discovered that, at low fluence and at low molecular hydrogen concentrations, wavefront distortion can be expressed as a power function of the number of pulses to which the high purity silica glass has been exposed. For example, assuming that the high purity silica glass containing low molecular hydrogen concentration has been exposed to pulses of constant pulse duration and fluence, wavefront distortion by the glass can be characterized by the following equation ("Equation 2"):

$$\frac{\Delta n}{n} = a\left(\frac{NF^2}{\tau}\right)^b$$

where n represents the index of refraction of the glass prior to exposure to any radiation pulses, Δn represents the change in the glass's index of refraction caused by repeated exposure to pulses of radiation, F is the exposure fluence of the radiation pulse, N the number of pulses to which the glass has been exposed, T is a measure of the pulse duration, and b and a are constants which may vary from wavelength to wavelength but do not vary from glass to glass. As discussed more fully below, at low fluences, glasses containing relatively high concentrations of molecular hydrogen do not follow this or any other power function. It should be noted that this dependence of wavefront distortion predictability on molecular hydrogen concentration is not observed at high fluences.

Illustratively, for the purposes of the present invention, wavefront distortion is to be deemed as evolving predictably over time if wavefront distortion (e.g., Δn) can be predicted, for example, using a power function such as the one set forth in Equation 2, to within ±10 ppm (e.g., to within ±8 ppm, to within ±5 ppm, to within ±2 ppm, to within ±1 ppm, to within ±0.8 ppm, to within ±0.5 ppm, to within ±0.2 ppm, and/or to within ±0.1 ppm) after more than 100 million pulses (e.g., after more than 200 million pulses, after more than 300 million pulses, after more than 400 million pulses, and/or after more than 500 million pulses).

Still additionally or alternatively, the high purity fused silica lithography glass's molecular hydrogen concentration can be characterized in terms of whether wavefront distortion is caused by negative density changes (i.e., expansion) and/or photorefractive effects in the high purity fused silica glass upon exposure to pulsed ultraviolet lithography radiation produced, for example, by an ArF excimer laser at a fluence of less than about 1.5 mJ/cm²/pulse. Applicants have discovered that, at low fluence (e.g., at fluences less than 10 mJ/cm²/pulse, such as at the illustrative fluences set forth above) wavefront distortion (e.g., Δn) in high purity silica glass containing relatively high levels of molecular hydrogen can be attributed not only to compaction (i.e., densification) of the high purity silica glass, but also to expansion of the high purity silica glass and/or to a phenomenon referred to herein as photorefraction (i.e., a change in refractive index which is not associated with density changes (e.g., resulting from expansion or densification) of the high purity silica glass). Applicants have also discovered that, in contrast, high purity silica glasses containing relatively low levels of molecular hydrogen, when exposed to pulsed radiation of low fluence, experience negligible wavefront distortion (e.g., Δn) caused by negative density changes and/or photorefraction. Again, it should be noted that this dependence of wavefront distortion caused by negative density changes and/or photorefraction on molecular hydrogen concentration is not observed at high fluences.

Illustratively, for the purposes of the present invention, wavefront distortion (e.g., Δn) caused by negative density changes and/or photorefraction is to be deemed as being negligible if wavefront distortion (e.g., Δn) caused by negative density changes and/or photorefraction is less than about 0.2 ppm (e.g., less than about 0.1 ppm, less than about 0.05 ppm, and/or is too small to be measured).

As explained in greater detail elsewhere herein, wavefront distortion caused by negative density changes can be measured by interferometry and/or birefringence, whereas photorefraction can be measured by comparing the results of birefringence and interferometry experiments.

High purity silica glasses having the desired levels of molecular hydrogen can be conveniently prepared by the flame hydrolysis method (which typically produces high purity silica glass ingot having a molecular hydrogen concentration of about $0.3 \times 10^{18}$ molecules/cm³) and by an optional post treatment of the ingot to either add or remove molecular hydrogen from the sample. For example, high purity silica glasses having molecular hydrogen concentration of greater than about $0.3 \times 10^{18}$ molecules/cm³ can be prepared by soaking the ingot in $H_2$ at high pressure and at about 500° C. High purity silica glasses having molecular hydrogen concentration of less than about $0.3 \times 10^{18}$ molecules/cm³ can be prepared by outgassing the molecular hydrogen in the glass ingot, for example, by heating the glass ingot to about 500° C. or higher in air. The preparation method of high purity silica glasses suitable for use in the present invention can further include selecting a high purity silica glass having a molecular hydrogen concentration in the desired range from a group of high purity silica glasses, some of which have a molecular hydrogen concentration lying within the desired range and some of which have a molecular hydrogen concentration lying outside the desired range. For example, high purity silica glasses suitable for use in the present invention can be prepared by a method which includes: selecting a desired range of molecular hydrogen concentrations which provide the desired wavefront distortion properties (e.g., a wavefront distortion that evolves predictably over time and/or a negligible wavefront distortion caused by negative density changes and/or photorefractive effects); providing a group of high purity silica glasses, some of which have a molecular hydrogen concentration lying within the desired range and some of which have a molecular hydrogen concentration lying outside the desired range; and selecting a high purity silica glass having a molecular hydrogen concentration in the desired range from this group of high purity silica glasses. Illustratively, it has been found that, for ArF laser fluences below 0.05 mJ/cm²/pulse, a molecular hydrogen concentration range of between about $0.05 \times 10^{18}$ molecules/cm³ and about $0.3 \times 10^{18}$ molecules/cm³ (such as between about $0.05 \times 10^{18}$ molecules/cm³ and $0.18 \times 10^{18}$ molecules/cm³ or between $0.22 \times 10^{18}$ molecules/cm³ and about $0.3 \times 10^{18}$ molecules/cm³) is desirable. Further, it has been found that, for ArF laser fluences between about 0.05 mJ/cm²/pulse and about 0.13 mJ/cm²/pulse, a molecular hydrogen concentration range of between about $0.3 \times 10^{18}$ molecules/cm³ and about $0.5 \times 10^{18}$ molecules/cm³ is desirable.

Once a suitable pulsed ultraviolet radiation source for producing ultraviolet lithography radiation and a suitable high purity fused silica lithography glass are provided, as discussed above, ultraviolet radiation from the pulsed ultraviolet radiation source is used to form a lithography pattern. The lithography pattern is then reduced to produce a reduced lithography pattern, and the reduced lithography pattern is projected onto a ultraviolet radiation sensitive lithography medium to form a printed lithography pattern. At least one of the forming, reducing, and projecting steps includes transmitting the ultraviolet lithography radiation through the high purity fused silica lithography glass.

One illustrative process of formation, reduction, and projection is illustrated in FIG. 1. Ultraviolet radiation 4 from the pulsed ultraviolet radiation source 6 is passed though mask 8. Mask 8 is patterned so as to reflect or absorb a portion of ultraviolet radiation 4 in a predetermined pattern, thus producing lithography pattern 2. Various optical elements (e.g., lens 7 and grating 9) can be used to manipulate ultraviolet radiation 4 from ultraviolet radiation source 6 prior to pattern formation, and for purposes of the present invention, any such manipulations are to be considered as being part of the lithography pattern formation step. Once the lithography pattern is formed, it is reduced to produce reduced lithography pattern 10, typically by transmitting the patterned radiation through one or more lenses 12 and/or other optical elements (not shown). Lenses 12 and other optical elements can be conveniently held in position with respect to one another in housing 14, which, together with lenses 12 and other optical elements, is commonly referred to as a lens barrel 16. Finally, reduced lithography pattern 10 is projected onto ultraviolet radiation sensitive lithography medium 18 to form a printed lithography pattern. Various optical elements (not shown) can be used to manipulate the reduced lithography pattern, and for purposes of the present invention, any such manipulations are to be considered as being part of the projection step.

As is clear from the above description of the lithography process of the present invention and from FIG. 1, ultraviolet radiation 4 from the pulsed ultraviolet radiation source 6 is transmitted by various optical elements, including the optional optics used to manipulate the ultraviolet radiation prior to pattern formation, the mask (i.e., the transmitting portion of the mask) used to form the lithography pattern, any optional optics which might be present to manipulate the ultraviolet radiation subsequent to pattern formation but prior to reduction (which manipulations are to be considered to be part of the reduction step), the lenses and other optical elements which are used in the reduction step, and the optional optics used to manipulate the ultraviolet radiation subsequent to reduction (i.e., during the projection step).

As indicated above, at least one of the forming, reducing, and projecting steps includes transmitting the ultraviolet lithography radiation through the high purity fused silica lithography glass. This can be carried out by forming at least one of the optical elements described in the preceding paragraph from the high purity fused silica lithography glass of the present invention. Preferably, at least some (and, more preferably, all) of the lenses and other optical elements used in the reduction step are formed from a high purity fused silica lithography glass of the present invention. In addition, where optical elements are used to transmit the ultraviolet radiation in the projection step, it may be desirable also to form such optical elements from a high purity fused silica lithography glass of the present invention.

Other methods and optical components can be used to carry out the formation, reduction, and projection steps referred to herein, such as, for example, those described in European Patent Application No. EP 0 779 558 A2 to Hashimoto, U.S. Pat. No. 5,880,817 to Hashimoto, U.S. Pat. No. 6,174,830 to Jinbo et al., U.S. Patent Publication No. 2001/0000508 of Jinbo et al., and U.S. Patent Publication No. 2001/0012099 of Kumagai, which are hereby incorporated by reference.

The present invention also relates to lithography systems which include a pulsed ultraviolet radiation source for producing ultraviolet lithography radiation having a wavelength shorter than about 300 nm at a fluence of less than 10 mJ/cm$^2$/pulse. Suitable pulsed ultraviolet radiation sources, wavelengths, and fluences for use in the lithography systems of the present invention include those described above in conjunction with the discussion of the present invention's lithography method. The lithography systems also include at least one synthetic glass optical member which transmits lithography radiation from the pulsed ultraviolet radiation source. Illustratively, the at least one synthetic glass optical member can be any of the optical elements described above in conjunction with the discussion of the present invention's lithography method. Particularly, with reference again to FIG. 1, the at least one synthetic glass optical member can be lenses 12 and/or any of the other optical elements involved in the reduction and projection steps of the lithography method of the present invention. In one inventive lithography system, the at least one synthetic glass optical member includes a high purity fused silica lithography glass having a concentration of molecular hydrogen of between about $0.02 \times 10^{18}$ molecules/cm$^3$ and about $0.18 \times 10^{18}$ molecules/cm$^3$. In another inventive lithography system, the at least one synthetic glass optical member includes a high purity fused silica lithography glass having a concentration of molecular hydrogen of between about $0.05 \times 10^{18}$ molecules/cm$^3$ and $0.18 \times 10^{18}$ molecules/cm$^3$ or having a concentration of molecular hydrogen of between $0.22 \times 10^{18}$ molecules/cm$^3$ and about $0.5 \times 10^{18}$ molecules/cm$^3$. Within these ranges, suitable concentrations of molecular hydrogen include those described above in conjunction with the discussion of the present invention's lithography method. Additionally or alternatively, the concentration of molecular hydrogen in the high purity fused silica lithography glass can be characterized as being sufficiently low such that wavefront distortion of the ultraviolet lithography radiation caused by the high purity fused silica glass evolves predictably over time. Still additionally or alternatively, the concentration of molecular hydrogen in the high purity fused silica lithography glass can be characterized as being sufficiently low such that wavefront distortion of the ultraviolet lithography radiation caused by negative density changes and/or photorefractive effects in the high purity fused silica glass is negligible.

The present invention also relates to a method for producing a synthetic high purity fused silica glass optical member having a predictably evolving wavefront distortion when exposed to pulsed ultraviolet lithography radiation having a wavelength shorter than about 300 nm at a fluence of less than 10 mJ/cm$^2$/pulse. The method includes limiting molecular hydrogen concentration in the high purity fused silica glass optical member to between about $0.05 \times 10^{18}$ molecules/cm$^3$ and about $0.5 \times 10^{18}$ molecules/cm$^3$. Within these ranges, suitable concentrations of molecular hydrogen include those described above in conjunction with the discussion of the present invention's lithography method.

The present invention also relates to synthetic glass optical members (e.g., a lens or a grouping of lenses, such as a lens barrel) for use with pulsed ultraviolet radiation having a wavelength shorter than about 200 nm (e.g., radiation from an ArF excimer laser) and a fluence of less than about 8 mJ/cm$^2$/pulse (e.g., a fluences less than about 6 mJ/cm$^2$/pulse, of less than about 4 mJ/cm$^2$/pulse, of less than about 2 mJ/cm$^2$/pulse, of less than about 1.5 mJ/cm$^2$/pulse, of less than about 1 mJ/cm$^2$/pulse, of less than about 0.5 mJ/cm$^2$/pulse, of less than about 0.2 mJ/cm$^2$/pulse, of less than about 0.1 mJ/cm$^2$/pulse, of less than about 0.05 mJ/cm$^2$/pulse, and/or of less than about 0.02 mJ/cm$^2$/pulse). In one inventive synthetic glass optical member, the member includes a high purity fused silica glass having a concentration of molecular hydrogen of between about $0.05 \times 10^{18}$ molecules/cm$^3$ and about $0.18 \times 10^{18}$ molecules/cm$^3$. In another inventive synthetic glass optical member, the member includes a high purity fused silica glass having a concentration of molecular hydrogen of between about $0.05 \times 10^{18}$ molecules/cm$^3$ and $0.18 \times 10^{18}$ molecules/cm$^3$ or having a concentration of molecular hydrogen of between $0.22 \times 10^{18}$ molecules/cm$^3$ and about $0.5 \times 10^{11}$ molecules/cm$^3$. Within these ranges, suitable concentrations of molecular hydrogen include those described above in conjunction with the discussion of the present invention's lithography method. In still another inventive synthetic glass optical member, the member includes high purity fused silica glass having a concentration of molecular hydrogen sufficiently low so that wavefront distortion caused by the high purity fused silica glass evolves predictably over time.

The concentration of molecular hydrogen in the high purity fused silica glass optical member can be limited by any suitable method, such as by controlling the level of hydrogen gas used during the formation of the high purity silica glass ingot, by an optional post treatment of the ingot to either add or remove molecular hydrogen from the sample, and/or by selecting a high purity silica glass having a molecular hydrogen concentration in the desired range from a group of high purity silica glasses, some of which have a molecular hydrogen concentration lying within the desired range and some of which have a molecular hydrogen concentration lying outside the desired range. Further details with respect to each of these methods are described above in conjunction with the discussion of the present invention's lithography method.

The present invention is further illustrated by the following examples.

EXAMPLES

There is a considerable body of work in the literature documenting the densification (compaction) of fused silica under high-energy irradiation (Primak et al., *J. Appl. Phys.*, 39:5651 (1968), which is hereby incorporated by reference) and, more recently, induced by deep-UV excimer laser sources operating at wavelengths of 157-nm, 193-nm, and 248-nm (Rothschild et al., *Appl. Phys. Lett.*, 55:1276 (1989); Allan et al., *Opt. Lett.*, 21(24):1960 (1996); Schenker et al., "Optical Microlithography", *Proc. SPIE*, vol. 2726 (1996); Borrelli et al., *J. Opt. Soc. Am. B*, 14(7):1606 (1997); Liberman et al., *J. Non-Cryst. Solids*, 244:159 (1998); and Borrelli et al., *Opt. Lett.*, 24(20):1401 (1999), which are hereby incorporated by reference. Although the mechanism involved is not completely understood, the effect has been well characterized, for 193-nm and 248-nm exposures, by the following power-law representation ("Equation 3"):

$$\frac{\Delta \rho}{\rho} = \frac{-\Delta V}{V} \alpha \left( \frac{NF^2}{\tau} \right)^b$$

Here $\rho$ is the density and V is the volume of the glass, F is the peak exposure fluence, N the number of pulses in millions, and $\tau$ is a measure of the laser pulse duration. The value of the power b is of the order of 0.6 for both 248-nm and 193-nm exposure, whereas the value of the prefactor $\alpha$ is 0.43 for 193-nm radiation and 0.043 for 248-nm radiation.

Because of the observed reciprocity of the exposure dose expressed by Equation 3, most of the experimental data reported thus far have been obtained at relatively high exposure fluence in order to accelerate the damage process. In actual use in photolithographic lens systems, the fluence would be much less, for example, in the range of 0.1–10 mJ/cm$^2$, although the number of exposure pulses would be much higher.

Recently, Van Peski has reported that, at low exposure fluence, the structural deformation of silica induced by polarized 193-nm irradiation does not correspond to the expected densification behavior. In fact, in a number of samples (obtained from different suppliers), evidence of "expansion" is observed.

Example 1

Measurement of Induced Birefringence and Wavefront Distortion of Excimer-exposed Silica and the Effect of Incident Polarization In the present study, we measured the induced birefringence and wavefront distortion of excimer-exposed silica having different compositions, specifically with known molecular hydrogen concentration. To explicitly investigate the effect of incident polarization, exposure conditions using linearly polarized and unpolarized light were used. We chose to use 248-nm excitation (Lumonics model 600 KrF excimer laser) rather than 193-nm in our study. Since the KrF laser is naturally unpolarized, we needed to use a polarizing beam splitter for some of our experiments. A robust polarizer is available for use at 248-nm but not at 193-nm. As we are primarily interested in low fluence exposure, we were able to take advantage of the lower 248-nm excitation rate relative to 193-nm for the same nominal fluence without loss of generality in our results. As we showed previously, the densification of silica induced by 248-nm exposure follows the same power law as 193-nm, the difference between the two wavelengths being in the prefactor, suggesting that the processes are fundamentally the same and that the two processes differ only in rate. The use of 248-nm radiation for these experiments is, therefore, believed to be a matter of rate dependence on the wavelength and not a mechanistic difference.

Figure 2A:
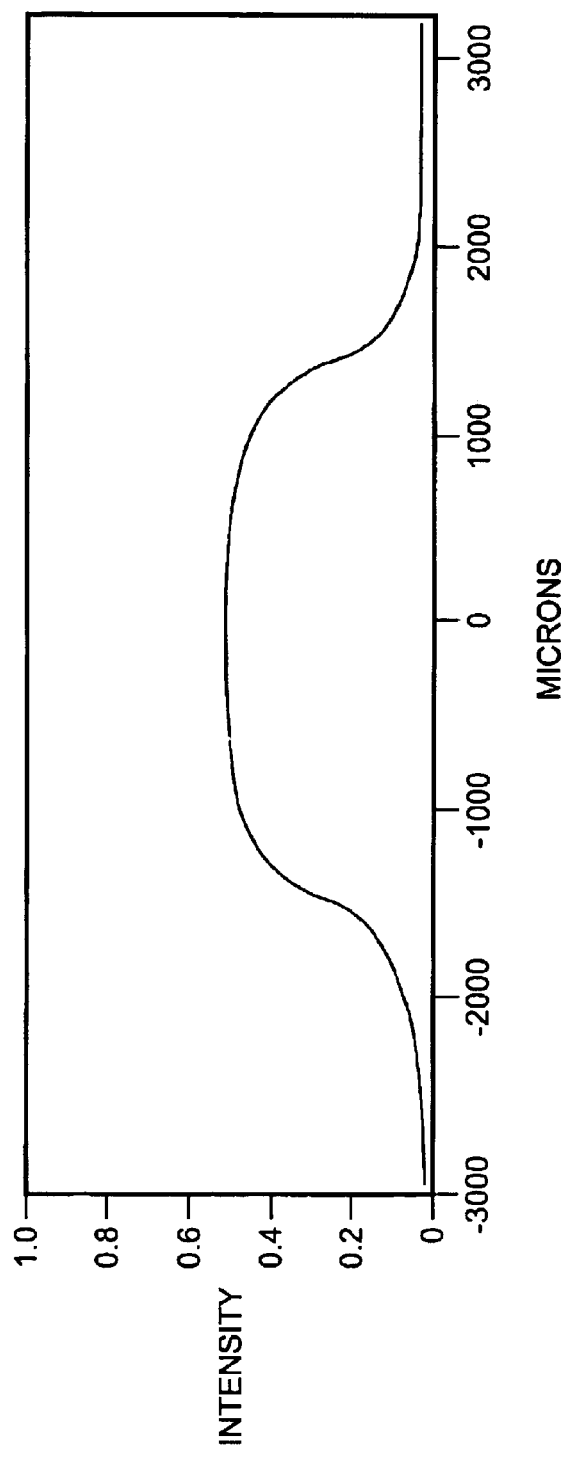
FIGS. 2A and 2B are images, obtained using a CCD camera, of intensity profiles along the horizontal (FIG. 2A) and vertical (FIG. 2B) axes of an exposure beam used in a method of the present invention.
Figure 2B:
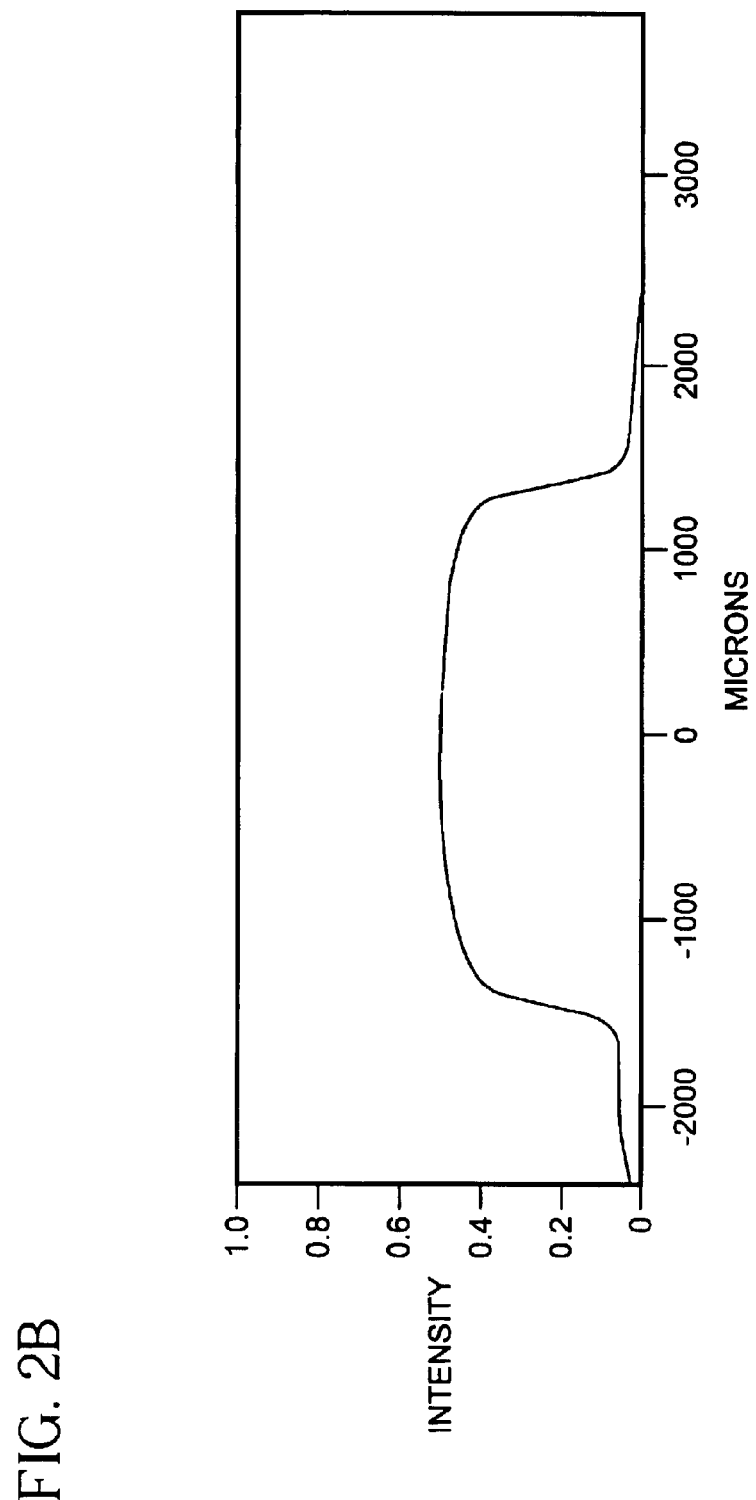

A 3 or 5-mm circular aperture was placed before the sample such that a flattop intensity profile was produced on the sample. A beam profile through the 3-mm aperture, obtained using a Photon Inc. Model 2300 Beam profiler is shown in FIGS. 2A (horizontal axis) and 2B (vertical axis). The exposure fluence was calculated from the measured power through the aperture. Optical retardation was measured using a CRI LC-SCOPE™. To avoid edge effects in the birefringence measurement, sample dimensions were significantly larger than the aperture. In general, there is a residual background birefringence pattern that must be taken into account to properly interpret the laser-induced stress. In some samples, the magnitude of this residual stress is comparable to the induced stress, especially in the early exposure. The birefringence was quantified by measuring where the residual stress and the induced stress have the same principal axes.

The silica samples were obtained by flame hydrolysis fabrication. The hydroxyl content of the glass was about 800 ppm (by weight), as measured by infrared spectroscopy. The molecular H$_2$ of the material made by direct deposition was approximately $3.5 \times 10^{17}$ molecules/cm$^3$ SiO$_2$, as measured by the strength of the stretching mode of H$_2$ that appears at 4135 cm$^{-1}$. This material is referred to here as Sample A. Samples with H$_2$ concentrations in excess of $10^{19}$ molecules/cm$^3$ were prepared by soaking silica samples obtained by flame hydrolysis in H$_2$ at high pressure and at 500° C. These materials are referred to here as Sample B. We have previously found that less than an additional 10 ppm OH is produced by the hydrogen soak, and, consequently, the chemical composition is believed not to be significantly altered by the H$_2$ treatment.

Figure 3A:
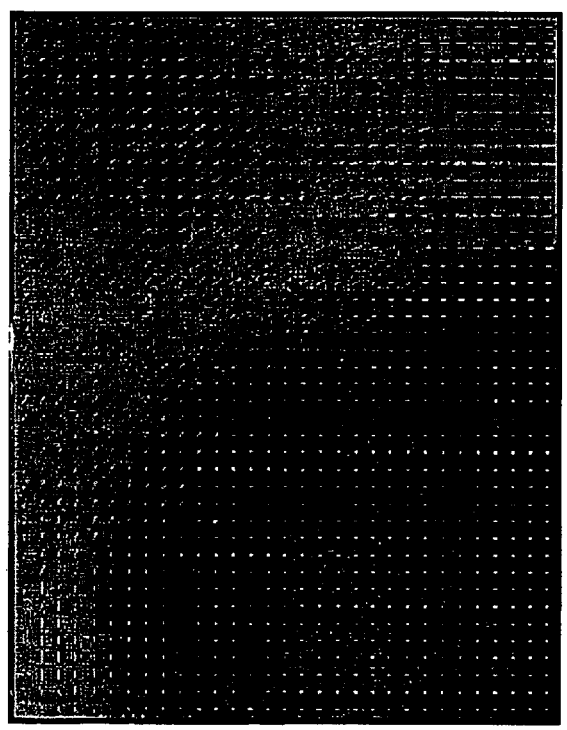
FIGS. 3A–3D are optical retardation diagrams for a comparative high purity silica glass sample having a molecular hydrogen concentration of greater than 10$^{19}$ molecules/cm$^3$ exposed with linearly polarized 248-nm laser light for 170×10$^6$ pulses at 10-mJ/cm$^2$ (FIGS. 3A and 3B) and exposed with unpolarized 248-nm laser light for 168× 10$^6$ pulses at 10 mJ/cm$^2$ (FIGS. 3C and 3D). Sample thickness in both cases was 40 mm.
Figure 3B:
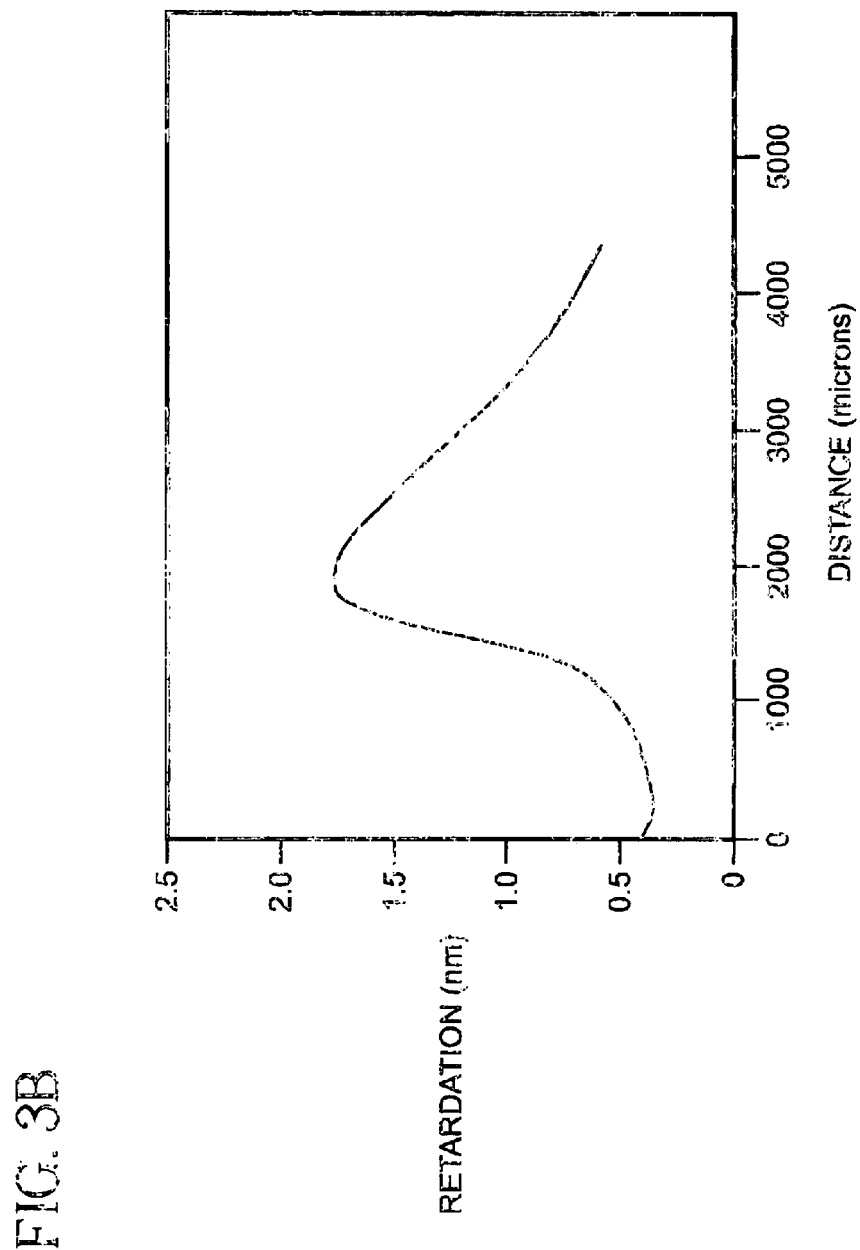
Figure 3C:
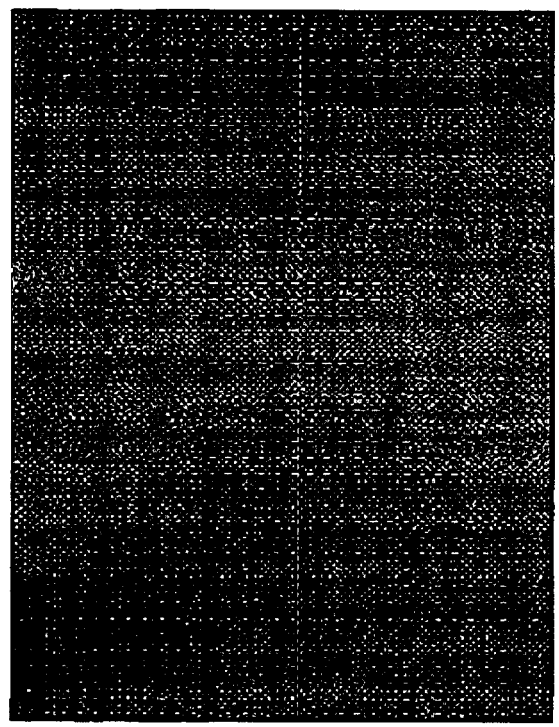
Figure 3D:
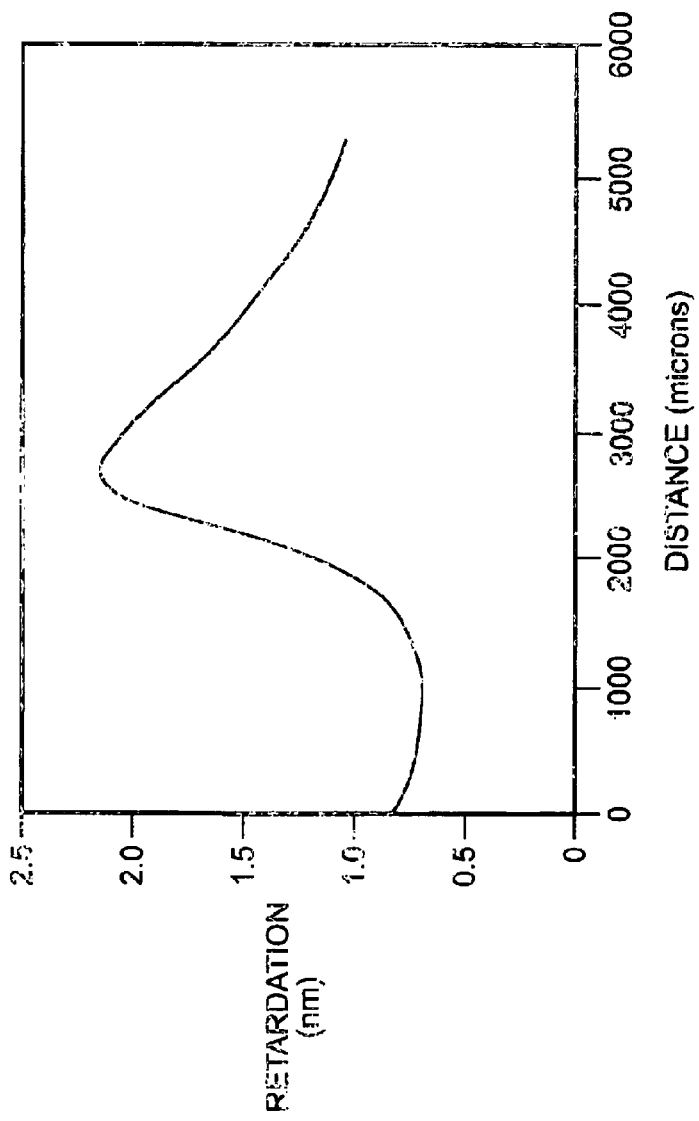

The results shown in FIGS. 3A–3D are the optical retardation plots (birefringence) of a hydrogen-loaded silica sample (Sample B) after exposure to approximately 170×10⁶ pulses at 10-mJ/cm²/pulse with linearly polarized 248-nm light (FIGS. 3A and 3B) with linearly unpolarized 248-nm light (FIGS. 3C and 3D). One quadrant of the exposed areas of the exposures is shown in FIGS. 3A and 3C with the aperture boundary evident. The vectors in each of FIGS. 3A and 3C indicate the direction of the slow axis (higher refractive index). In both cases, the data show that the glass just outside the exposed region has the slow axis of retardation aligned tangentially to the boundary. This indicates the hoop stress component is in tension and the radial component is in compression. This stress state is consistent with substantially isotropic expansion within the exposed region of the two exposure areas. FIGS. 3B and 3D are line plots indicating the magnitude of the optical retardance as the aperture is traversed. The fact that the birefringence is not zero inside the exposed area is due to the initial background value. Comparison of the line plots shows that the amount of optical retardance for the two exposures is found to be equivalent for roughly the same number of pulses (0.34 and 0.36 nm/cm). This suggests that the state of the polarization does not influence the amount of expansion realized in a sample.

This point appears to be in conflict with Van Peski, which suggested a link between linearly polarized exposure through a circular aperture. In contrast, as demonstrated in FIGS. 3A–3D, we observe the existence of a substantially isotropic excimer laser-induced expansion, and we see no relation between expansion and the state of polarization of the laser.

Example 2

Studies to Ascertain the Cause of Expansion

Figure 4A:
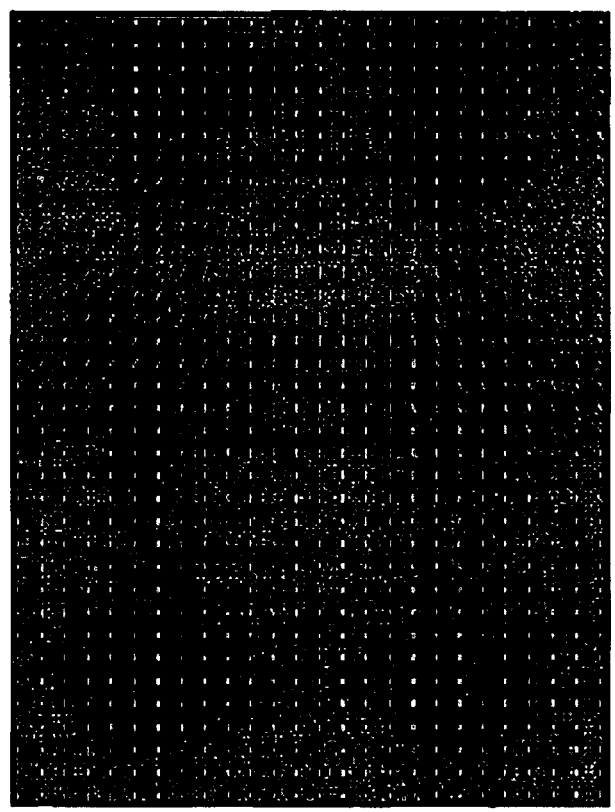
FIGS. 4A–4B are optical retardation diagrams for a high purity silica glass sample having a molecular hydrogen concentration of about 10$^{17}$ molecules/cm$^3$ in accordance with a method of the present invention exposed with linearly polarized 248-nm laser light for 60×10$^6$ pulses at 10-mJ/ cm$^2$.

In an attempt to ascertain the origin of expansion relative to the more commonly observed compaction, we measured the induced birefringence for a sample containing a low $H_2$ concentration of approximately $10^{17}$ molecules $H_2/cm^3$ $SiO_2$ (Sample A). This sample was exposed to 60×10⁶ pulses at a fluence of 10 mJ/cm² at 248-nm, the same conditions used in Example 1 for the higher $H_2$ glass. Here, linearly polarized light was used. The optical retardance vector diagram, set forth in FIG. 4A, shows that the radial component of stress is in tension and the hoop component is in compression, indicating that the exposed area of Sample A is more dense than the unexposed areas of Sample A. A line plot indicating the magnitude of the optical retardance in Sample A as the aperture is traversed is set forth in FIG. 4B.

Figure 4B:
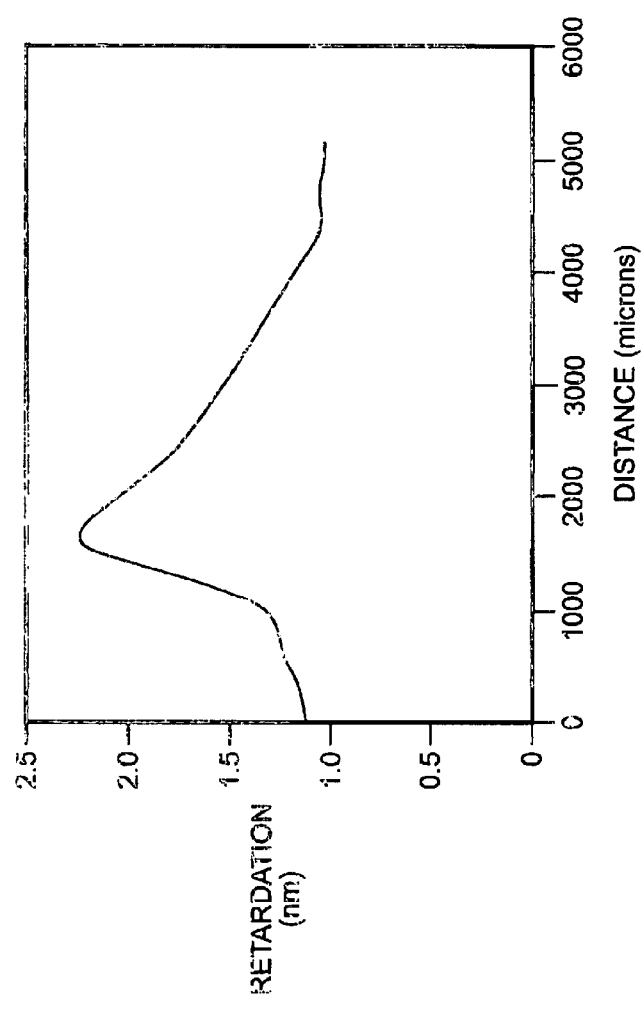

Comparison of the data of FIGS. 3A–3D with FIGS. 4A–4B demonstrates the role of molecular hydrogen in determining the sign of the laser-induced structural change (i.e., whether compaction or expansion results from exposure to the laser). The observed expansion in the hydrogen-loaded Sample B is consistent with the results reported in Shelby, *J. Appl. Phys.*, 50:3072 (1979), which is hereby incorporated by reference, where density decreases were observed in high $H_2$ silica samples upon exposure to high-energy radiation. Concomitant with the density decrease, Shelby observed the formation of SiOH as a consequence of the irradiation. The decreased density of the photolyzed glass was attributed to the increase in SiOH content.

It should be noted that we chose to load silica with molecular hydrogen at low temperature in order to study only the effect of hydrogen on the photo-induced processes. Although the role of hydrogen in our experiments is clear, it should be kept in mind that glasses with inherently high hydrogen concentrations would not necessarily exhibit exactly this behavior.

Example 3

Time Evolution of Birefringence

Figure 5:
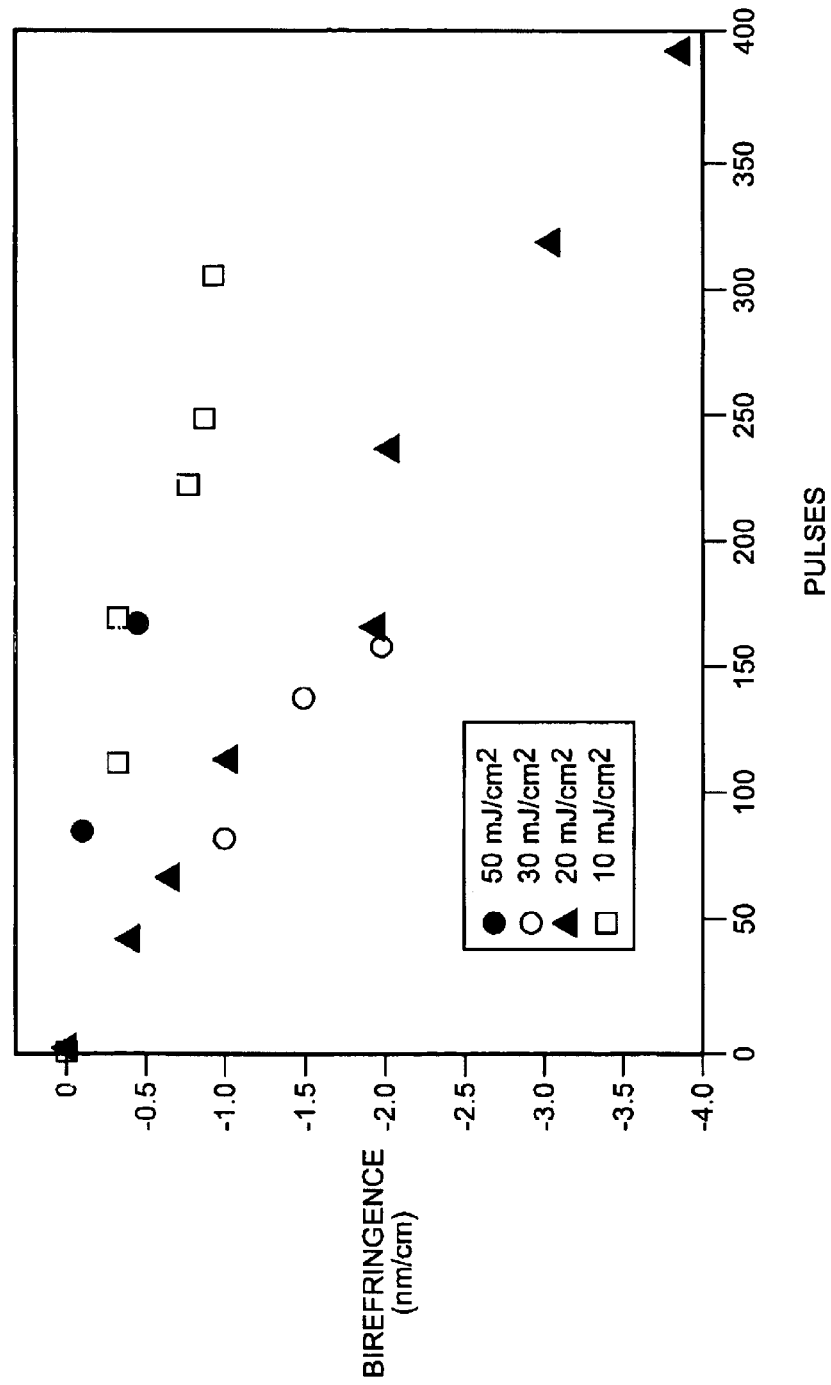
FIG. 5 is a graph of birefringence vs. exposure to linearly polarized 248-nm radiation at various fluences for a comparative high purity silica glass sample having a molecular hydrogen concentration of greater than 10$^{19}$ molecules/cm$^3$.
Figure 6:
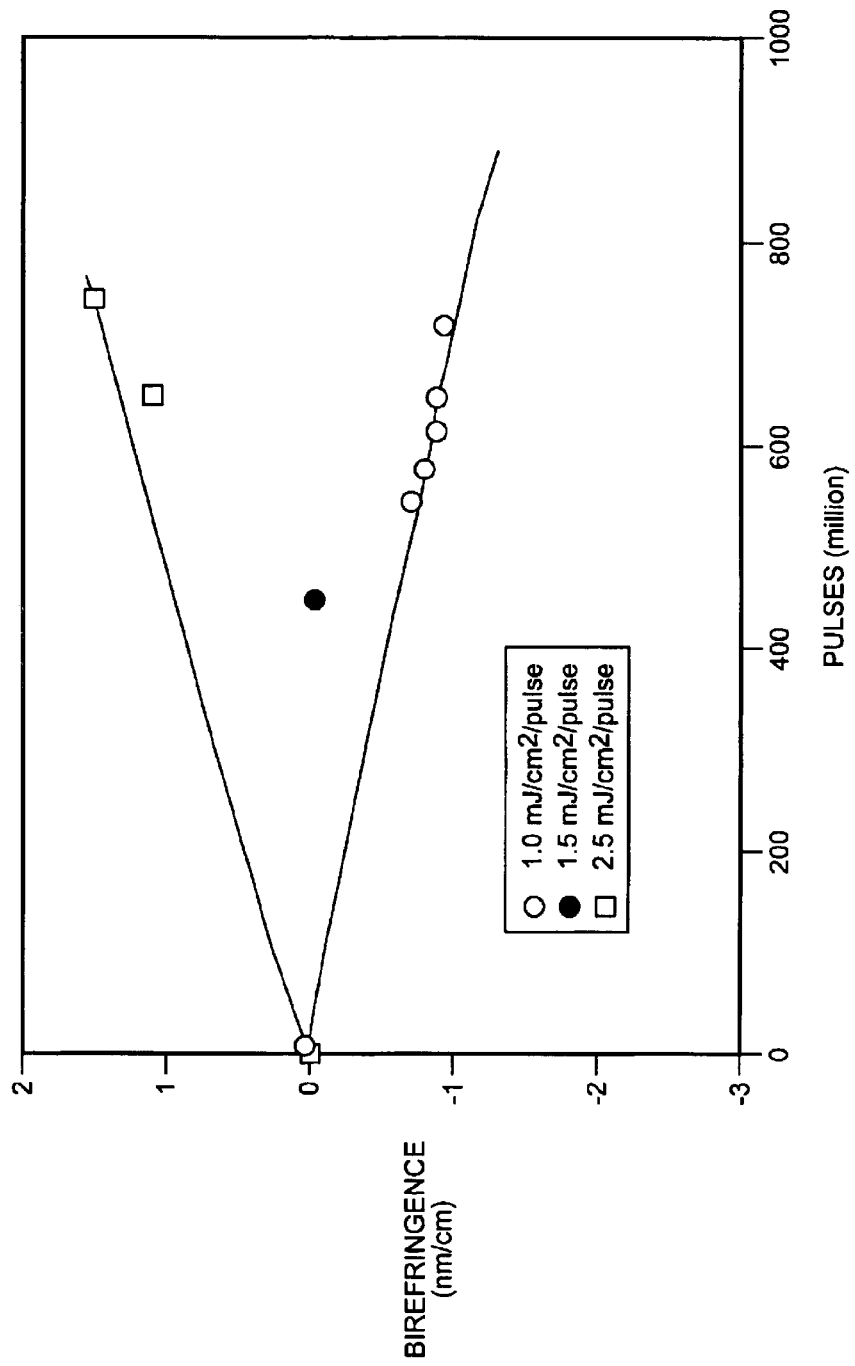
FIG. 6 is a graph of birefringence vs. exposure to linearly polarized 193-nm radiation at various fluences for a comparative high purity silica glass sample having a molecular hydrogen concentration of greater than 10$^{19}$ molecules/cm$^3$.

The 248-nm exposure time evolution of birefringence for Sample B (high $H_2$ concentration) is shown in FIG. 5 as a function of several values of the fluence. For all cases, the birefringence was found to be linear with pulses. The expansion rate was not monotonic with increasing fluence but reaches a maximum rate at about 20–30 mJ/cm². This behavior appears to be consistent with the idea of two concurrent and competing phenomena with different fluence dependencies. We have observed the same behavior even more explicitly with 193-nm exposure, as set forth in FIG. 6, where an exposure of Sample B (high $H_2$ concentration) at 2.5 mJ/cm² results in net compaction, while an exposure at 1.0 mJ/cm² produces net expansion.

Example 4

Interferometry Experiments

We also used interferometry to measure the laser induced density change, anticipating an advanced wavefront corresponding to the expansion indicated by the birefringence. A ZYGO Mark IV interferometer at 633-nm was used to measure the same exposed spots from which the birefringence measurements were made. To the extent that both measurements derive from the same density change, they should yield the same value for the "unconstrained" value of $\Delta\rho/\rho$ (Borrelli et al., *J. Opt. Soc. Am. B*, 14(7):1606 (1997), which is hereby incorporated by reference). We calculated the value of $\Delta\rho/\rho$ that would be obtained from the birefringence and the wavefront (interferometry) measurements, and we show this result in Table 1 for the case of the low hydrogen Sample A and the high hydrogen Sample B.

TABLE 1

|  | $H_2$ (molecules/cm³) | $\Delta\rho/\rho$ (ppm) calculated from birefringence | $\Delta\rho/\rho$ (ppm) calculated from interferometry |
|---|---|---|---|
| Sample B[1] | >10¹⁹ | −0.8 | −0.2 |
| Sample A[2] | 10¹⁷ | +1.2 | +1.3 |

[1]after exposure to 224 × 10⁶ pulses at 10 mJ/cm², 248-nm linearly polarized radiation
[2]after exposure to 64 × 10⁶ pulses at 13 mJ/cm², 248-nm linearly polarized radiation As is shown in Table 1, for the high hydrogen sample we did indeed observe an advanced wavefront consistent with expansion. There is, however, a discrepancy in the magnitude of $\Delta\rho/\rho$ derived from it as compared to the value obtained from the birefringence. To check the accuracy of this finding, we also compared the respective values of the unconstrained $\Delta\rho/\rho$ for a low hydrogen sample. For the low hydrogen sample, the two estimates both yielded compaction and agree within the experimental error of the two measurements.

We propose to explain the observed disagreement between the birefringence and interferometric measurements in the high hydrogen sample in terms of the photorefractive effect. In this explanation, the photorefractive effect makes an additional contribution to the interferometric measurement of the phase shift, over and above that associated with the density change. This implies that there are three contributors to the interferometrically measured phase front: expansion, compaction, and photorefraction, whereas in a birefringence measurement there are only the first two. Each of these components has its own fluence (and $H_2$) dependence.

The net index change as measured by interferometry can be written in the following way ("Equation 4"):

$$\Delta n_{INT} = \left(\frac{\Delta \rho}{\rho}\right)_{Den} \left(\frac{\Delta n}{\Delta \rho / \rho}\right) + \Delta n_{PR}(F, H_2)$$

In the following equation ("Equation 5"), we have written the net density change from contribution of the compaction and expansion processes as would be obtained from the birefringence measurement:

$$\left(\frac{\Delta \rho}{\rho}\right)_{Den} = N[f_1(F, H_2)_{comp} - f_2(F, H_2)_{exp}]$$

We arbitrarily represent two separate functions, fi, for compaction and expansion that yield a net density change. This formulation is based in part on the interpretation of the result shown in FIG. 6. The lack of explicit knowledge of the exact functional relationships notwithstanding, one can still make some predictions. For example, at some constant exposure fluence value, the phase change as measured by birefringence would be developing at a slow rate over time when the compaction and expansion rates are nearly equal as indicated by Equation 5. Yet, from Equation 4, a relatively positive (retarded) phase change would be observed by interferometry because of the photorefractive contribution.

Correspondingly, at some other constant fluence exposure, the phase change as measured by birefringence could be large and negative due to the dominance of the expansion, and the interferometric phase change could be small due to the compensation provided by the photorefractive effect. These cases are observed in the high $H_2$ glass and shown in Table 2.

TABLE 2

| Exposure conditions | $\Delta \rho / \rho$ (ppm) calculated from birefringence | $\Delta \rho / \rho$ (ppm) calculated from interferometry |
| --- | --- | --- |
| $318 \times 10^6$, 20 mJ/cm$^2$ | −3.1 | Below detection |
| $94 \times 10^6$, 50 mJ/cm$^2$ | −0.20 | +3.8 |

The significance of using both birefringence and interferometry becomes clear for an application where phase changes through induced birefringence are considered differently than those due to the overall refractive index change.

We can also estimate the dependence of the photorefractive contribution on $H_2$ concentration. We exposed a sample containing $1 \times 10^{19}$ molecules $H_2$/cm$^3$ $SiO_2$ under the same conditions used for a sample with three times as much as $H_2$. Use of the interferometric data in conjunction with the birefringence data allows us to estimate the photorefractive contribution as a function of hydrogen concentration as indicated by Equation 4. The finite element analysis (as described, for example, in Borrelli et al., *J. Opt. Soc. Am. B*, 14(7):1606 (1997), which is hereby incorporated by reference) was employed in order to normalize the experimental geometric and exposure parameters. The result is set forth in FIG. 7, and the data used to obtain FIG. 7 are provided in Table 3.

TABLE 3

| Sample | $H_2$ (molec./cm$^3$) | $\Delta$n (ppm) from interferometry | $\Delta$n (ppm) from birefringence[1] | $\Delta$n (ppm) from photorefraction |
| --- | --- | --- | --- | --- |
| A | $0.012 \times 10^{19}$ | 0.32 | 0.38[2] | −0.06 (±0.1) |
| C | $1 \times 10^{19}$ | 0.33 | −0.07[2] | 0.40 |
| B | $3 \times 10^{19}$ | 0.89 | −0.13[3] | 1.02 |

Figure 7:
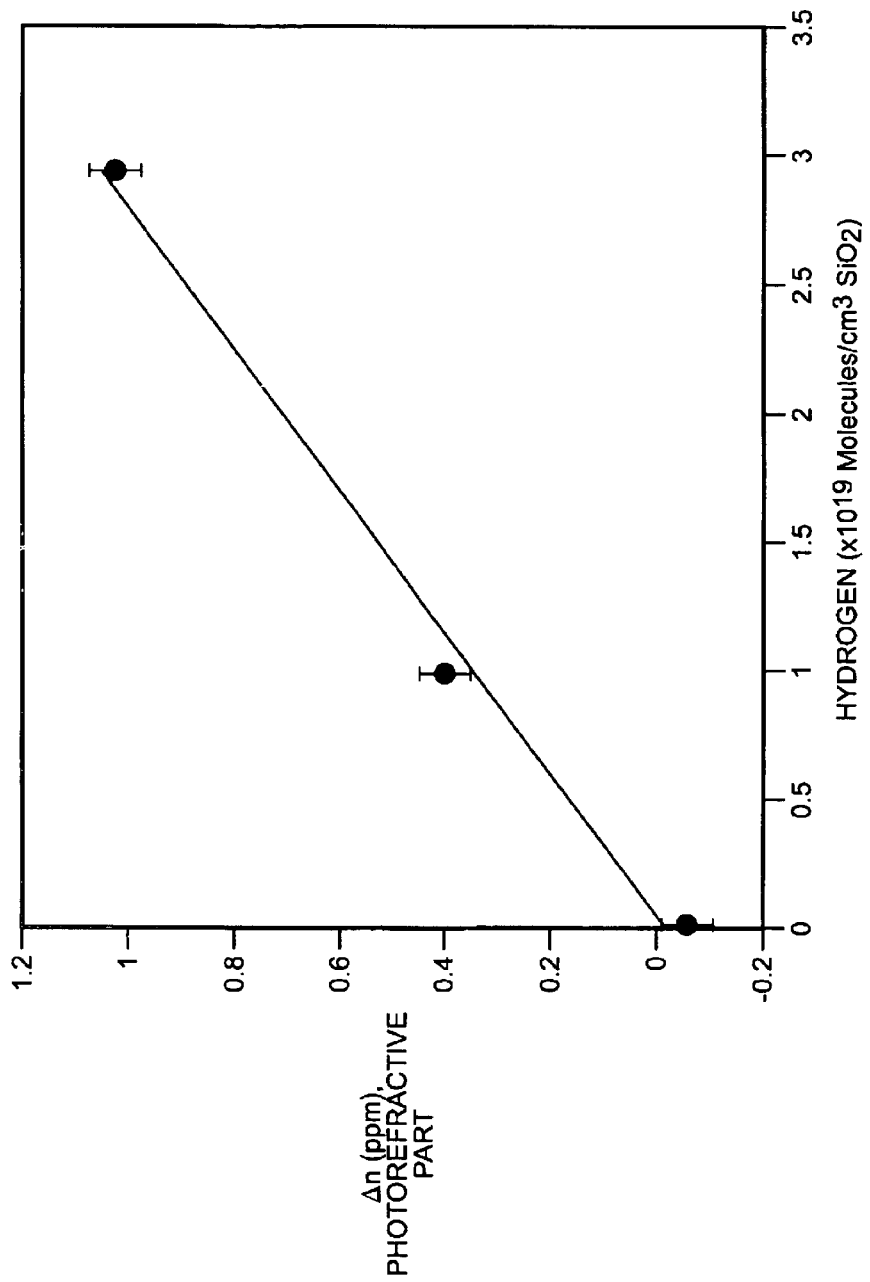
FIG. 7 is a graph showing the dependence of photorefractive component on molecular H$_2$ concentration. Samples B and C were exposed for approximately 400 million pulses at 1 mJ/cm$^2$ at 193 nm. Sample A is from the experiments related to FIGS. 4A and 4B.

[1] the conversion from birefringence to $\Delta$n is derived from photoelastic analysis using a finite element method
[2] the results are 0.7/250 wave/nm for samples A and C
[3] the result is 1/250 wave/nm for sample B As FIG. 7 shows, the photorefractive effect appears to be roughly linear with the hydrogen concentration.

From a comparison of the birefringence data for the two hydrogen concentrations, one can see that these data are qualitatively consistent with Equation 5 if we assume that the expansion is also monotonically increasing with hydrogen content. At the lower hydrogen concentration, one would expect a smaller expansion contribution, all other things being equal. One should expect, therefore, a less negative value of the birefringence, as is the case.

Although the invention has been described in detail for the purpose of illustration, it is understood that such detail is solely for that purpose, and variations can be made therein by those skilled in the art without departing from the spirit and scope of the invention which is defined by the following claims.

What is claimed:

1. A lithography system comprising:
 a pulsed ultraviolet radiation source for producing ultraviolet lithography radiation having a wavelength shorter than about 300 nm at a fluence of less than 10 mJ/cm$^2$/pulse;
 a lithography pattern forming subsystem configured to produce a lithography pattern of the ultraviolet lithography radiation;
 at least one reducing optical element configured to reduce the size of the lithography pattern; and
 at least one projecting optical element configured to manipulate the reduced lithography pattern,
 wherein at least one reducing optical element or projecting optical element is a synthetic glass optical member comprising a high purity fused silica glass having a concentration of molecular hydrogen of between about $0.02 \times 10^{18}$ molecules/cm$^3$ and $0.1 \times 10^{18}$ molecules/cm$^3$.

2. A Lithography system according to claim 1, wherein said pulsed ultraviolet radiation source produces ultraviolet lithography radiation having a wavelength shorter than about 200 nm.

3. A lithography system according to claim 1, wherein said pulsed ultraviolet radiation source is an ArF excimer laser.

4. A lithography system according to claim 1, wherein said pulsed ultraviolet radiation source produces ultraviolet lithography radiation at a fluence of less than about 1.5 mJ/cm$^2$/pulse.

5. A lithography system according to claim 1, wherein said pulsed ultraviolet radiation source produces ultraviolet lithography radiation at a fluence of less than about 0.05 mJ/cm$^2$/pulse.

6. A lithography system according to claim 1, wherein wavefront distortion of the ultraviolet lithography radiation caused by the high purity fused silica glass evolves predictably over time.

7. A lithography system according to claim 1, wherein wavefront distortion of the ultraviolet lithography radiation caused by density changes and/or photorefractive effects in the high purity fused silica glass is negligible.

8. A lithography system according to claim 1, wherein the high purity fused silica glass has a concentration of molecular hydrogen of between about $0.05 \times 10^{18}$ molecules/cm$^3$ and $0.1 \times 10^{18}$ molecules/cm$^3$ and wherein said pulsed ultraviolet radiation source is an ArF excimer laser which produces ultraviolet lithography radiation at a fluence of less than about 1.5 mJ/cm$^2$/pulse.

9. A lithography system according to claim 8, wherein wavefront distortion of the ultraviolet lithography radiation caused by density changes and/or photorefractive effects in the high purity fused silica glass is negligible.

10. A lithography system according to claim 1, wherein the high purity fused silica glass has a concentration of molecular hydrogen of between about $0.05 \times 10^{18}$ molecules/cm$^3$ and $0.1 \times 10^{18}$ molecules/cm$^3$.

* * * * *